United States Patent
Greer et al.

(10) Patent No.: US 9,224,783 B2
(45) Date of Patent: Dec. 29, 2015

(54) PLASMA DENSIFICATION OF DIELECTRICS FOR IMPROVED DIELECTRIC LOSS TANGENT

(71) Applicant: Intermolecular Inc., San Jose, CA (US)

(72) Inventors: Frank Greer, Pasadena, CA (US); Andy Steinbach, San Jose, CA (US); Wenxian Zhu, E. Palo Alto, CA (US)

(73) Assignee: Intermolecular, Inc., San Jose, CA (US)

( * ) Notice: Subject to any disclaimer, the term of this patent is extended or adjusted under 35 U.S.C. 154(b) by 31 days.

(21) Appl. No.: 14/139,222

(22) Filed: Dec. 23, 2013

(65) Prior Publication Data

US 2015/0179436 A1 Jun. 25, 2015

(51) Int. Cl.
*H01L 21/31* (2006.01)
*H01L 21/469* (2006.01)
*H01L 27/18* (2006.01)
*H01L 39/24* (2006.01)

(52) U.S. Cl.
CPC ............ *H01L 27/18* (2013.01); *H01L 39/2493* (2013.01)

(58) Field of Classification Search
None
See application file for complete search history.

(56) References Cited

U.S. PATENT DOCUMENTS

| 5,624,873 | A * | 4/1997 | Fonash et al. ................. 438/487 |
| 5,753,564 | A | 5/1998 | Fukada |
| 6,465,372 | B1 | 10/2002 | Xia |
| 8,288,292 | B2 | 10/2012 | Antonelli |
| 2003/0021307 | A1 * | 1/2003 | Yamazaki ...................... 372/24 |
| 2005/0269606 | A1 * | 12/2005 | Mouli ............................ 257/292 |
| 2007/0023758 | A1 * | 2/2007 | Tsurume et al. ................ 257/66 |
| 2007/0141256 | A1 * | 6/2007 | Liebau et al. ............... 427/249.1 |
| 2009/0197086 | A1 * | 8/2009 | Rathi et al. ..................... 428/408 |
| 2010/0003833 | A1 | 1/2010 | Tsuji |
| 2010/0047473 | A1 * | 2/2010 | Roca I Cabarrocas et al. ............................ 427/575 |
| 2013/0247965 | A1 * | 9/2013 | Swanson et al. .............. 136/252 |

FOREIGN PATENT DOCUMENTS

| EP | 0599730B1 A | 6/1999 |
| JP | 04196601 A | 7/1992 |
| JP | 09069518 A | 3/1997 |
| JP | 10079384 A | 3/1998 |

OTHER PUBLICATIONS

Pi et al; Fluorine in Silicon Diffusion Trapping and Precipitation; Apr. 17, 2003; The American Physical Society; Unknown.
Burin et al; Universal Dielectric Loss in Glass from Simultaneous Bias and Microwave Fields; Apr. 8, 2013; The American Physical Society; Unknown.

* cited by examiner

*Primary Examiner* — Mamadou Diallo
*Assistant Examiner* — Jay C Chang

(57) ABSTRACT

Defects in hydrogenated amorphous silicon are reduced by low-energy ion treatments and optional annealing. The treatments leave strongly-bonded hydrogen and other passivants in place, but increase the mobility of loosely-bonded and interstitially trapped hydrogen that would otherwise form unwanted two-level systems (TLS). The mobilized hydrogen atoms may be attracted to unused passivation sites or recombined into $H_2$ gas and diffuse out of the deposited layer. The treatments also increase the density of the material. The optional anneal may partially crystallize the layer, further densify the layer, or both. The reduced number of defects and the increased crystallinity reduce the loss tangent of amorphous silicon dielectrics for superconducting microwave devices.

19 Claims, 5 Drawing Sheets

PLASMA DENSIFICATION OF DIELECTRICS FOR IMPROVED DIELECTRIC LOSS TANGENT

BACKGROUND

Related fields include thin-film microwave devices with superconducting components.

At temperatures<100 mK, amorphous silicon (a-Si) is a dielectric. Its low cost and ease of fabrication make it attractive as an interlayer dielectric (ILD) for superconducting interconnects and components for planar microwave devices, but its loss tangent (~$10^8$) is much larger than that of single-crystal Si (~$10^7$) at microwave frequencies (e.g., 3-300 GHz). The loss tangent is believed to be caused by defects occurring during deposition.

ILD films are typically tenths of microns thick (e.g., 300-500 nm). At this thickness, many surface treatments are ineffective to remove defects from the bulk of the film. This is also an inconvenient thickness to form by the precisely controlled methods of atomic layer deposition (ALD); because each ALD cycle creates a monolayer on the order of 0.1 nm thick, a layer hundreds of nm thick would take too long to be cost-effective.

Hydrogenation has been observed to improve a-Si loss tangent in some cases. However, only hydrogen (H) that is strongly bonded to Si helps to reduce loss. H that is trapped in interstices of the a-Si, or that is weakly attracted to dangling bond sites of two neighboring Si atoms, can form a two-level system (TLS) that increases noise and loss. For example, early studies of Josephson-junction-based qubits for quantum computing attributed loss and decoherence primarily to extraneous TLS effects from defects in dielectrics.

Therefore, a need exists for methods to reduce the microwave-frequency loss tangent of a-Si films by reducing or eliminating defects in the bulk of micron-scale films as well as on the surface. Preferably, this method should avoid or minimize the creation of additional TLS.

SUMMARY

The following summary presents some concepts in a simplified form as an introduction to the detailed description that follows. It does not necessarily identify key or critical elements and is not intended to reflect a scope of invention.

In some embodiments, a hydrogenated a-Si layer is deposited by chemical vapor deposition (CVD). During or after the formation of the layer, ions are injected into the CVD chamber where the layer is/was deposited. In some embodiments, the ions and the plasma-generating energy are selected to avoid damaging the layer surface (e.g., argon (Ar) ions from a ~300 W plasma source). The ions transfer energy to the layer as they contact the layer surface. The added energy dislodges interstitial or weakly-bonded H atoms, but does not disturb strongly-bonded H atoms.

As the ions continue to transfer energy to the layer, the dislodged H atoms move through the a-Si. Some of the mobile H atoms may encounter available strong-bonding sites and be trapped. Other mobile H atoms may encounter each other, recombine into $H_2$, and outgas into the chamber ambient. The result is a denser Si film with fewer defects. In some embodiments, the ion treatment is done in-situ after the a-Si layer is formed. In some embodiments, the deposition may be paused periodically (e.g., every after every 3-6 nm of a-Si thickness) to ion-treat the completed part of the layer.

In some embodiments, the layer is annealed at 500-650 C for 5-60 min. Like the ion treatment, the annealing increases mobility of weakly-bonded or interstitial H. In addition, the annealing drives out $H_2$ and may at least partially crystallize the a-Si, further reducing defects.

BRIEF DESCRIPTION OF DRAWINGS

The accompanying drawings may illustrate examples of concepts, embodiments, or results. They do not define or limit the scope of invention. They are not drawn to any absolute or relative scale. In some cases, identical or similar reference numbers may be used for identical or similar features in multiple drawings.

DETAILED DESCRIPTION OF EXAMPLE EMBODIMENTS

A detailed description of one or more example embodiments is provided below. To avoid unnecessarily obscuring the description, some technical material known in the related fields is not described in detail. Semiconductor fabrication generally requires many other processes before and after those described; this description omits steps that are irrelevant to, or that may be performed independently of, the described processes.

Unless the text or context clearly dictates otherwise: (1) By default, singular articles "a," "an," and "the" (or the absence of an article) may encompass plural variations; for example, "a layer" may mean "one or more layers." (2) "Or" in a list of multiple items means that any, all, or any combination of less than all the items in the list may be used in the invention. (3) Where a range of values is provided, each intervening value is encompassed within the invention. (4) "About" or "approximately" contemplates up to 10% variation. "Substantially" contemplates up to 5% variation.

"Substrate," as used herein, may mean any workpiece on which formation or treatment of material layers is desired. Substrates may include, without limitation, silicon, germanium, silica, sapphire, zinc oxide, SiC, AlN, GaN, Spinel, coated silicon, silicon on oxide, silicon carbide on oxide, glass, gallium nitride, indium nitride and aluminum nitride, and combinations (or alloys) thereof. The term "substrate" or "wafer" may be used interchangeably herein. Semiconductor wafer shapes and sizes can vary and include commonly used round wafers of 50 mm, 100 mm, 150 mm, 200 mm, 300 mm, or 450 mm in diameter.

As used herein, a material (e.g. a dielectric material or an electrode material) will be considered to be "crystalline" if it exhibits greater than or equal to 25% crystallinity as measured by a technique such as x-ray diffraction (XRD), and "amorphous" otherwise. "Interlayer dielectric," "intermetallization dielectric," "bulk insulator," and "fill dielectric" are used interchangeably herein for an insulating dielectric layer that fills spaces between conducting interconnects (e.g., wiring layers, vias) or between the devices connected by the interconnects. Material descriptions such as "conductor,"

"superconductor," "semiconductor," "dielectric," and "insulator" may vary with temperature for a given material, and shall be used herein to describe the characteristics of the materials at the intended operating temperature of the device in which the materials are used. For example, "forming a superconducting layer" shall mean "forming a layer of a material expected to exhibit superconductivity at the intended operating temperature of the device being fabricated."

Figure 1A:
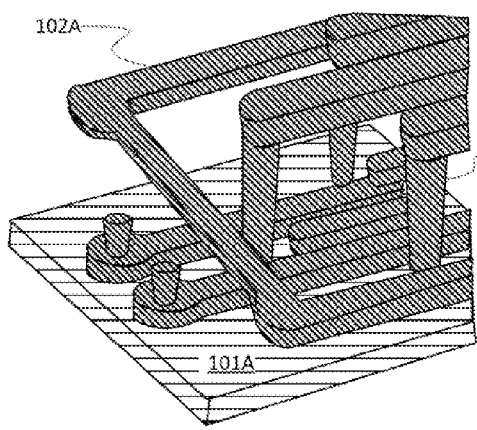
FIGS. 1A and 1B conceptually illustrate interconnects and interlayer dielectrics.
Figure 1B:
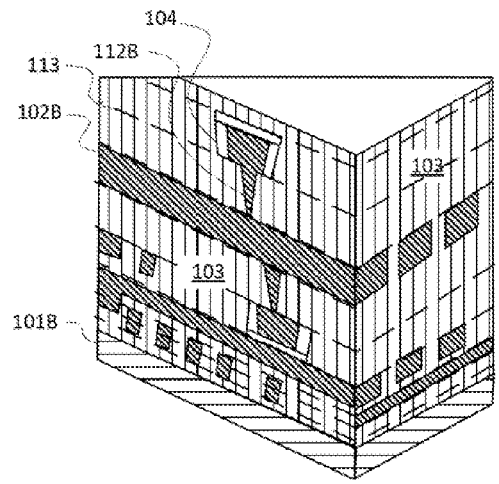

FIGS. 1A and 1B conceptually illustrate interconnects and interlayer dielectrics. FIG. 1A illustrates multiple layers of interconnects without showing the ILD, to better visualize the three-dimensional network of wirings 102a and vias 112A built up on substrate 101A. Substrate 101A may have other layers and structures below those shown. Typically, each wiring 102A begins as a blanket conductive layer formed on an ILD layer. The blanket layer is etched to form the separate conductive paths, and the resulting wiring is buried in another ILD layer. Vias 112A may be constructed similarly to wirings 102A, or alternatively they may be constructed by patterning the ILD; forming openings through the ILD and filling the openings with conductive material. Longer vias that penetrate more than one layer may be constructed as multiple segments, with the length of each segment being the thickness of one layer. Some formations may involve chemical-mechanical polishing (CMP) of either an ILD layer or a conductive layer to expose parts of buried structures. In superconducting microwave devices, the conductive elements (wirings and vias) may be Nb or Al.

FIG. 1B is a schematic cutaway view of several interconnect and device layers. Here, the ILD 103 is shown supporting the structures; heavy dotted lines 113 delineate the separately formed layers. The illustrated structures include some wirings 102B and vias 112B, and also some components 104 (e.g., transistors, capacitors, switches, resistors, resonators; in a superconducting device, the components may include Josephson junctions).

Figure 2:
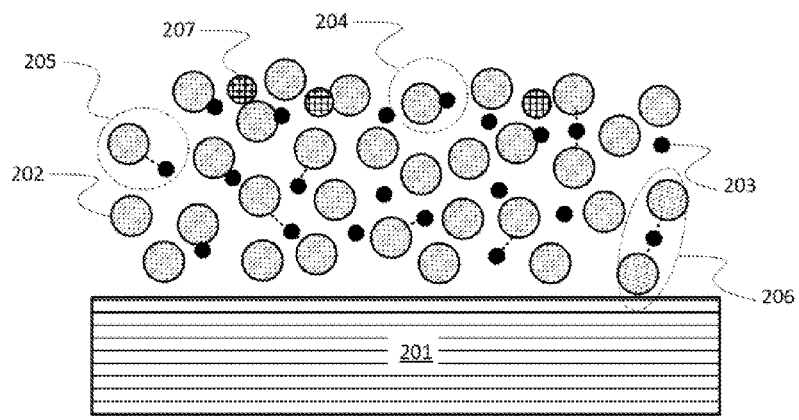
FIG. 2 conceptually illustrates a layer of hydrogenated a-Si with defects.

FIG. 2 conceptually illustrates a layer of hydrogenated a-Si with defects. This illustration is not intended to represent the hydrogenation level, defect density, or exact structure of any particular form of a-Si, but merely to introduce the graphic symbols for the various elements and bonds. The layer may be hydrogenated by using an H-containing Si CVD precursor such as silane, disilane or trisilane, or by depositing the Si in an H-containing ambient, or both. On substrate 201, which may have underlying layers and structures, the Si atoms 202 and H atoms 203 are randomly arranged in the amorphous layer. A strongly bonded Si—H pair 204 is represented by tangential contact of the Si and H. A weakly bonded Si—H pair 205 is represented by a dotted-line connection. In some cases, an H atom is weakly bonded to two neighboring Si atoms with a shared weak bond 206. Optionally, another element 207 may be present (e.g., from a fluorine (F) surface passivation treatment).

Figure 3:
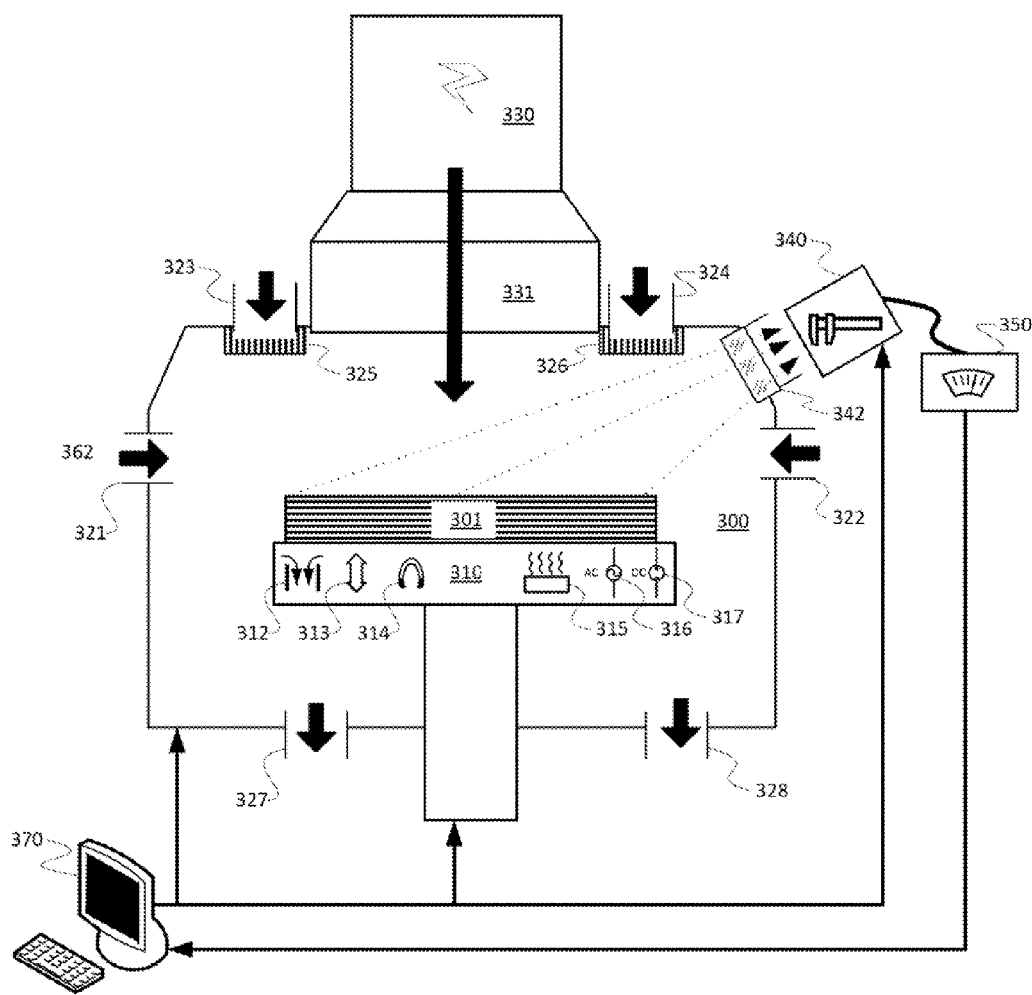
FIG. 3 is a block diagram of an example of a plasma-equipped CVD chamber.

FIG. 3 is a block diagram of an example of a plasma-equipped CVD chamber. Inside CVD chamber 300, substrate 301 is held by a substrate holder 310. Substrate holder 310 may be configured with vacuum 312 (for example, a vacuum chuck to grip the substrate); motion 313 in any direction, which may include tilt and rotation; a magnetic field source 314; heater or temperature control 315; or sources of AC 316 or DC 317 bias voltage. Chamber 300 also has gas inlets 321, 322, 323, 324 for CVD precursors, buffer gases, and purge gases. Exhausts 327, 328 may be coupled to vacuum pumps to remove gases from chamber 300. Some of the inlets may feed through one or more diffusers or "showerheads" 325, 326. In some embodiments, remote plasma chamber 330 may generate reactive species, such as ions, that enter chamber 300 through input adapter 331. In some embodiments, a direct plasma may be generated at or near the surface of substrate 301. Measurement system 340 may monitor substrate 301 through measurement ports 342. The measurements from measurement system 340 may be collected by a monitoring system 350.

Figure 4:
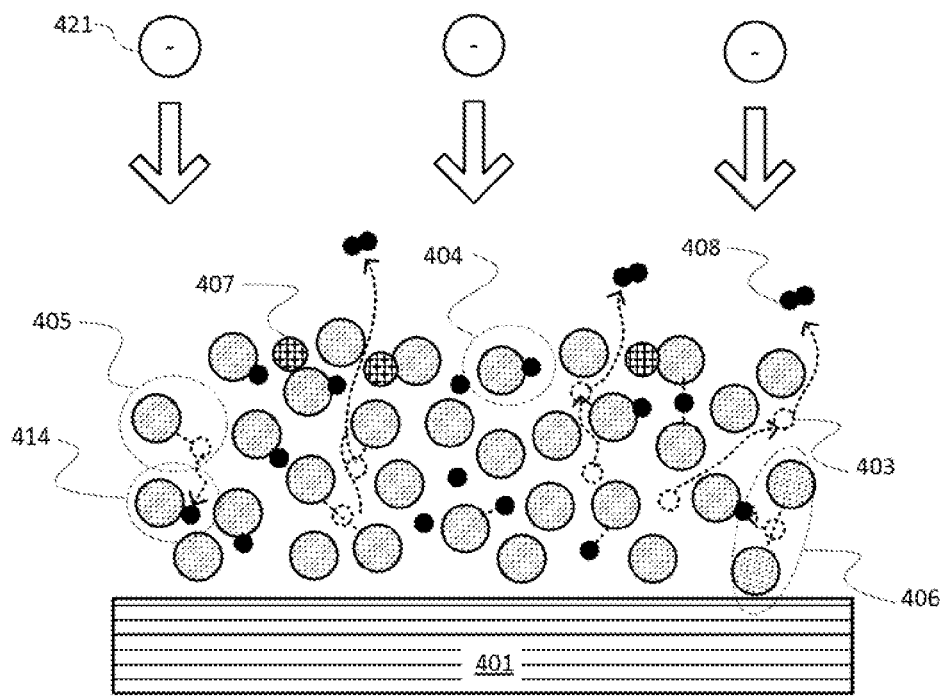
FIG. 4 conceptually illustrates the effect of ion treatment.

FIG. 4 conceptually illustrates the effect of ion treatment. Ions 421 (e.g., inert-gas ions) from a remote or direct plasma impact the surface of the a-Si layer on substrate 401 and transfer energy to the layer without chemically reacting. The transferred energy is not sufficient to break apart strongly bonded Si—H pairs 404 or dislodge heavier elements such as the F passivant 407, but it is sufficient to mobilize interstitial H atoms 403 and H atoms that are bonded weakly 405 or shared 406. Some of the mobilized H atoms may become situated to bond strongly, such as the H that moved from weak pair 405 into strong pair 414. Other mobilized H atoms will bond with each other and leave the layer as $H_2$ gas molecules 408. The result is a densified layer in which the strongly-bonded H atoms remain to passivate defects and the trapped or weakly bonded H atoms are driven out so they cannot form extraneous TLS. In some embodiments, the ions may include Ar ions, the chamber pressure during ion treatment may be about 0-2 Torr, the flow rate may be about 100-1000 sccm, and the plasma power may be about 100-350 W, e.g., 300 W.

Figure 5:
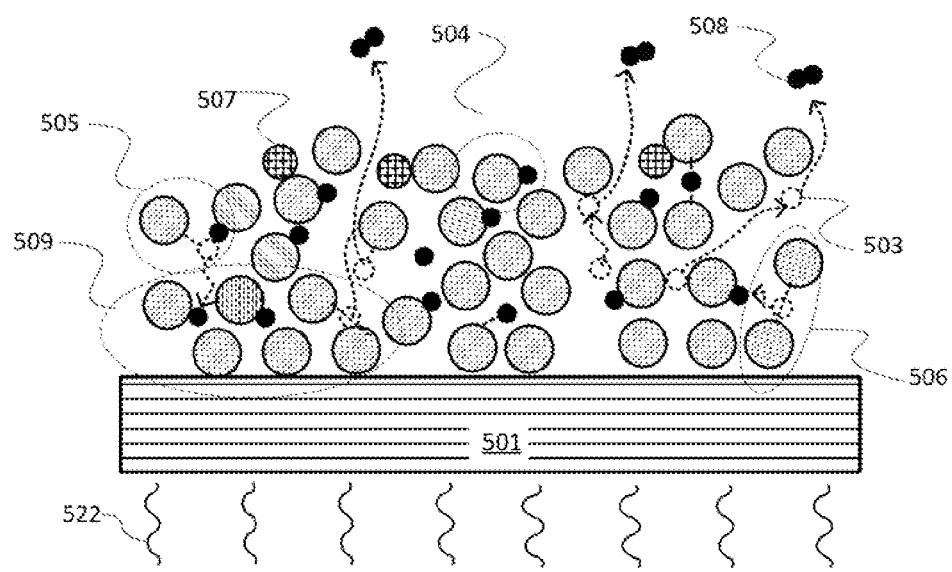
FIG. 5 conceptually illustrates the effect of annealing.

FIG. 5 conceptually illustrates the effect of annealing. The anneal temperature may be between about 500 and 650 C, e.g., 550 C, the anneal duration may be about 5-60 minutes, and the chamber pressure may be about 20-60 Torr. Like the ions in FIG. 4, heat 522 mobilizes H atoms that are not strongly bonded, such as interstitials 503 and those in shared bonds 506 and other weak bonds 505. Some may encounter a strong-bonding site 404 and others may combine into $H_2$ 508 and outgas. In some embodiments, the anneal may begin to crystallize the a-Si, forming localized regions of relatively ordered lattice structure 509. The annealing may also repair any damage to the surface from the impacts of ions in the ion treatment of FIG. 4.

Figure 6:
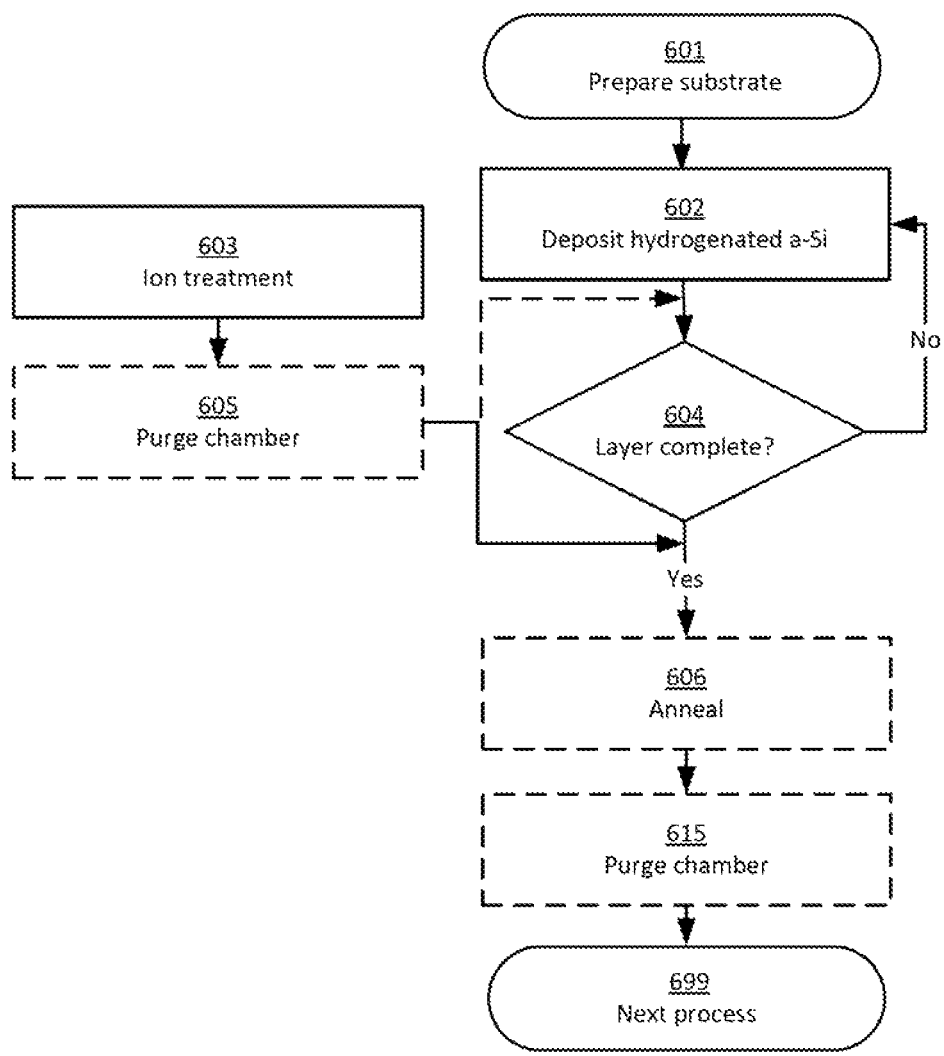
FIG. 6 is a process flowchart for forming a layer of ion-treated hydrogenated a-Si.

FIG. 6 is a process flowchart for forming a layer of ion-treated hydrogenated a-Si. Substrate preparation 601 may include a pre-clean, or the patterning or other partial removal of an underlying layer. Hydrogenated a-Si deposition 602 may include CVD using an H-containing Si CVD precursor such as silane, disilane, or trisilane. Hydrogen gas or a different H-containing gas may be added to the ambient during the Si deposition.

Ion treatment 603 may include Ar ions from a 100-350 W plasma at 100-1000 sccm flow rate. Ion treatment 603 may be performed in the same chamber as hydrogenated a-Si deposition 602. Optionally, a chamber purge 605 may follow ion treatment 603 to exhaust the H gas, excess ions, and other gases from the chamber. This purge and other purges described herein may optionally use an inert purge gas, such as Ar. Ion treatment 603 may be performed after deposition completion 604; e.g., after deposition of a 100-500 nm thick ILD layer. In some embodiments, repeated ion treatments 603 may be alternated with repeated partial depositions 602; for example, the deposition may pause after each 3-5 nm of thickness, the partial layer may be ion-treated 603, then the deposition 602 may continue. Optionally, an anneal 606 (e.g., 500-650 C for 5-60 min at 20-60 Torr) may follow the post-completion ion treatment 603. Anneal 606 may be performed in the same chamber as hydrogenated a-Si deposition 602. Anneal 606 may or may not partially crystallize the layer. In some embodiments, an additional chamber purge 615 may be performed after anneal 606 and before next process 699.

Figure 7:
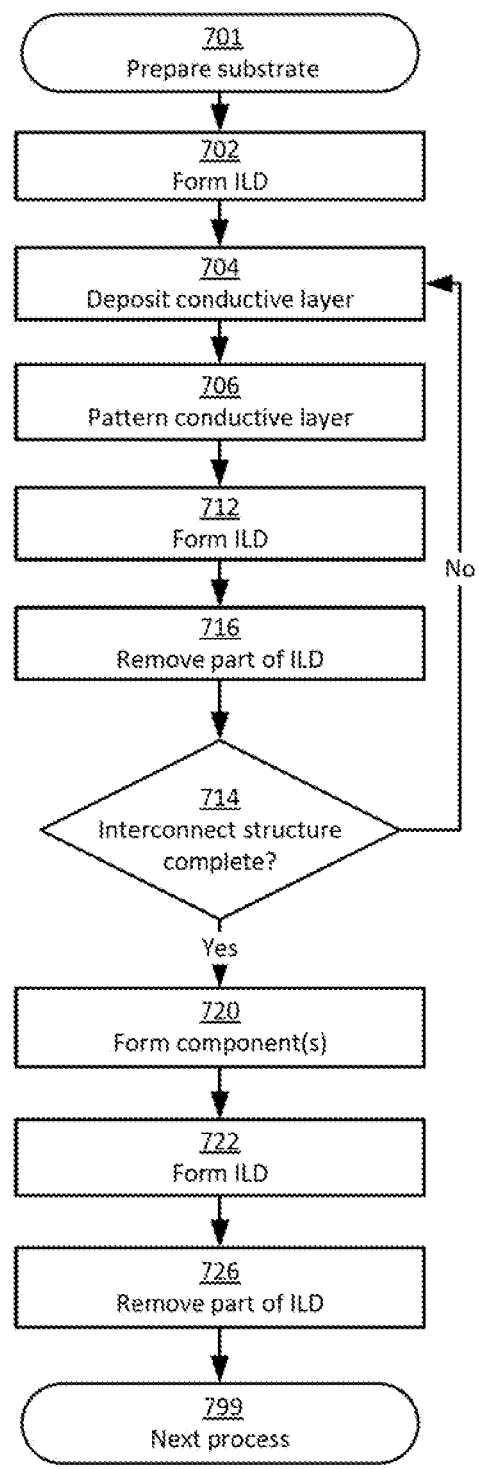
FIG. 7 is a process flowchart for creating an interconnect structure.

FIG. 7 is a process flowchart for creating an interconnect structure. Substrate preparation 701 may include a pre-clean or the formation of underlying layers or structures. ILD formation 702 may include a variation of the process of FIG. 6. Conductive-layer deposition 704 may be, for example, sputter deposition of a metal capable of superconductivity, such as Nb or Al. Conductive-layer patterning 706 may include etching the conductive layer to form wirings and/or vias. ILD formation 712 over the patterned conductive layer may include a variation of the process of FIG. 6. Removal 716 of part of the ILD layer, to allow connections to the structures below it, may include etching of openings or CMP. Steps 704-716 may be repeated to form additional interconnect levels. In some embodiments, intervening steps such as cleaning or annealing may be performed between any of the illustrated steps.

On completion 714 of the interconnect structure, one or more component layers may be added. Component formation 720 may include, for example, formation of superconducting Josephson junctions. The components may be formed over exposed (or otherwise accessible) connections to the underlying interconnect structure formed in steps 701-714. Optionally, one or more wirings and vias may be formed in the component layer. ILD formation 712 over the component layer may include a variation of the process of FIG. 6. Removal 726 of part of the ILD layer, to allow connections to the structures below it, may include etching of openings or CMP. Steps 704-716 may be repeated to form additional interconnect levels. In some embodiments, intervening steps such as cleaning or annealing may be performed between any of the illustrated steps.

Although the foregoing examples have been described in some detail to aid understanding, the invention is not limited to the details in the description and drawings. The examples are illustrative, not restrictive. There are many alternative ways of implementing the invention. Various aspects or components of the described embodiments may be used singly or in any combination. The scope is limited only by the claims, which encompass numerous alternatives, modifications, and equivalents.

What is claimed is:

1. A method comprising:
    forming a first layer on a substrate in a process chamber by chemical vapor deposition; and
    exposing the first layer to ions in situ in the process chamber;
        wherein the first layer comprises amorphous hydrogenated silicon;
        wherein the first layer has a thickness of between about 3 nm and 5 nm;
        wherein the first layer increases in density during the exposing by removing hydrogen from interstices and hydrogen at dangling bond sites while retaining hydrogen having strong bonds to silicon;
    after exposing the first layer to the ions, forming at least a second layer above the first layer; and
    exposing the second layer to ions;
        wherein the second layer comprises hydrogenated silicon and has a thickness of between about 3 nm and 5 nm;
        wherein the second layer is amorphous when formed;
        wherein a density of the second layer is higher after the exposing the second layer than before the exposing the second layer; and
        wherein a combination of an energy of the ions and a duration of the exposing the first layer and the second layer is selected based on the thickness of the first layer and the thickness of the second layer.

2. The method of claim 1, wherein the ions comprise argon ions.

3. The method of claim 1, wherein the first layer is formed as an amorphous layer.

4. The method of claim 1, wherein the first layer is formed from a hydrogen-containing silicon precursor.

5. The method of claim 4, wherein the hydrogen-containing silicon precursor comprises at least one of silane, disilane, or trisilane.

6. The method of claim 1, wherein the first layer is formed from a silicon precursor deposited in a hydrogen-containing ambient.

7. The method of claim 1, wherein the first layer further comprises fluorine.

8. The method of claim 7, wherein a concentration of fluorine in the first layer is substantially unchanged after the exposing.

9. The method of claim 1, wherein the forming and the exposing are performed in a single process chamber.

10. The method of claim 1, wherein the first layer is between about 100 nm and 500 nm thick.

11. The method of claim 1, wherein the first layer is exposed to the ions at a pressure of less than about 2 Torr.

12. The method of claim 1, wherein the first layer is exposed to the ions at a flow rate of about 100-1000 sccm.

13. The method of claim 1, further comprising purging the process chamber after the first layer is exposed to the ions.

14. The method of claim 1, further comprising annealing the first layer at a temperature between about 500 C and about 600 C after the first layer is exposed to the ions.

15. The method of claim 14, wherein the annealing continues for between about 5 minutes and about 60 minutes.

16. The method of claim 14, wherein a process chamber pressure during the annealing is between about 20 Torr and about 60 Torr.

17. The method of claim 14, wherein the first layer is partially crystallized after the annealing.

18. The method of claim 14, further comprising purging the process chamber after the annealing.

19. The method of claim 1, wherein after exposing the first layer to the ions, sputtering niobium over the first layer.

* * * * *